(12) United States Patent
Ganitzer et al.

(10) Patent No.: US 9,006,899 B2
(45) Date of Patent: Apr. 14, 2015

(54) LAYER STACK

(71) Applicant: Infineon Technologies AG, Neubiberg (DE)

(72) Inventors: Paul Ganitzer, Villach (AT); Kurt Matoy, Villach (AT); Martin Sporn, Villach (AT); Mark Harrison, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/716,017

(22) Filed: Dec. 14, 2012

(65) Prior Publication Data

US 2014/0167270 A1    Jun. 19, 2014

(51) Int. Cl.
*H01L 23/48* (2006.01)
*H01L 23/52* (2006.01)
*H01L 29/40* (2006.01)
*H01L 23/498* (2006.01)
*H01L 21/02* (2006.01)

(52) U.S. Cl.
CPC .... *H01L 23/49866* (2013.01); *H01L 21/02697* (2013.01); *H01L 2924/0002* (2013.01)

(58) Field of Classification Search
USPC .......... 257/763, 761, 764, 765, 766, 383
See application file for complete search history.

(56) References Cited

U.S. PATENT DOCUMENTS

| 2002/0086520 | A1* | 7/2002 | Chiang | 438/630 |
|---|---|---|---|---|
| 2005/0067062 | A1* | 3/2005 | Yoshinari et al. | 148/428 |
| 2006/0170113 | A1* | 8/2006 | Tanaka et al. | 257/778 |
| 2011/0092000 | A1* | 4/2011 | Coffy | 438/15 |
| 2012/0313230 | A1* | 12/2012 | Mengel et al. | 257/676 |

FOREIGN PATENT DOCUMENTS

WO    2006134534 A1    12/2006

* cited by examiner

*Primary Examiner* — A. Sefer
*Assistant Examiner* — Dilinh Nguyen
(74) *Attorney, Agent, or Firm* — Slater & Matsil, L.L.P.

(57) ABSTRACT

In one embodiment method, a first Ti based layer is deposited on the substrate. An intermediate Al based layer is deposited on the first layer, a second NiV based layer is deposited on the intermediate layer, and a third Ag based layer is deposited on the second layer. The layer stack is tempered in such a way that at least one inter-metallic phase is formed between at least two metals of the group containing Ti, Al, Ni and V.

7 Claims, 3 Drawing Sheets

LAYER STACK

TECHNICAL FIELD

The present invention relates to a method of fabricating a layer stack over a substrate, an electronic module, and a layer stack.

BACKGROUND

Soldering is a process in which two or more components, such as metal components, are joined together by melting and flowing a solder material into the joint. Semiconductor chips, for example power semiconductor chips, may be mounted on substrates or other semiconductor chips by using soldering methods. During soldering, however, inter-metallic phases can be formed between two or more of the metallic materials employed on either sides of the joint. These resulting inter-metallic phases may turn out to have a corrosion resistance, which is not sufficiently high, so that in a worst case the entire solder connection may break off. Therefore, there is a continuous need for providing stable and permanently reliable solder connections.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
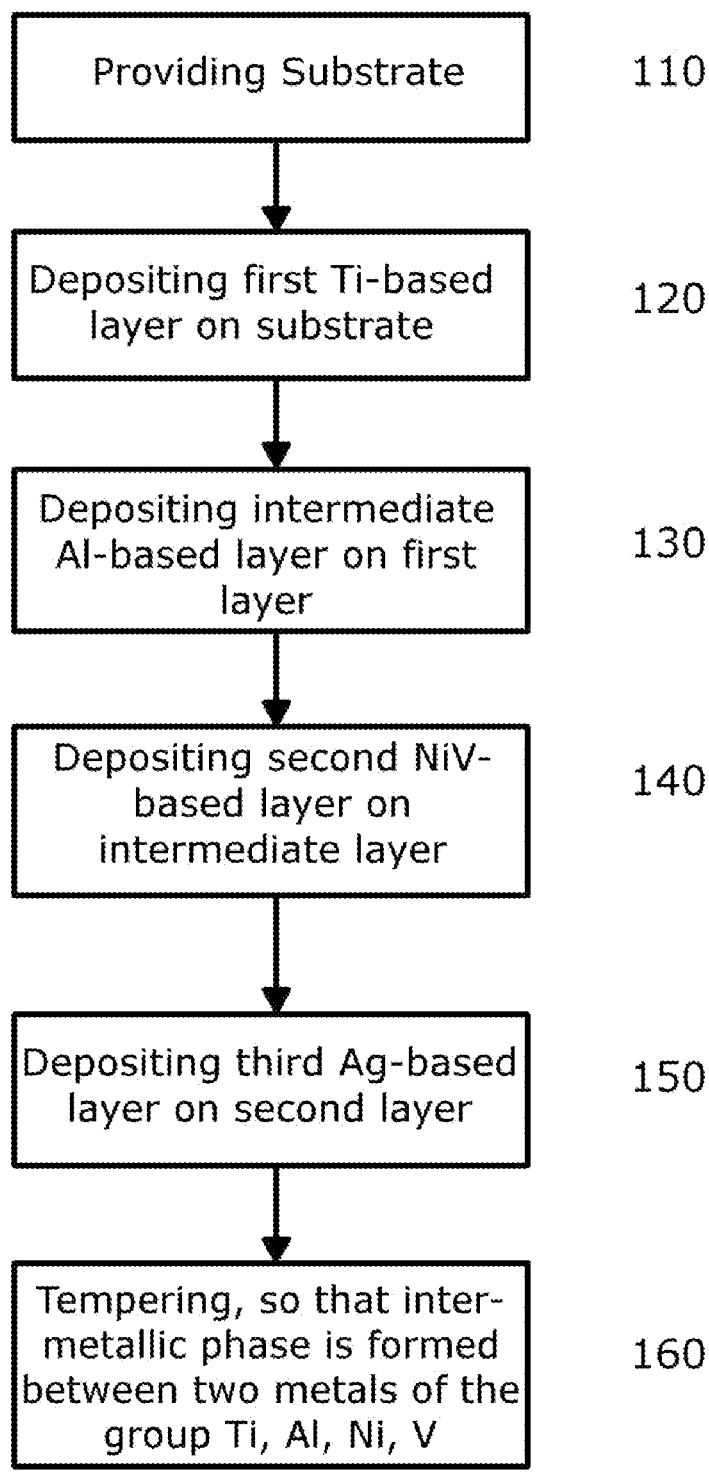
FIG. 1 shows a flow diagram for illustrating a method for fabricating a layer stack over a substrate according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic module and a method of fabricating a layer stack over a substrate may use various types of substrates, in particular semiconductor chips or circuits incorporated in the semiconductor chips, among them logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor or other structures or devices in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads may be made from any electrically conducting material, e.g., from a metal as aluminum, gold, or copper, for example, or a metal alloy, or an electrically conducting organic material, or an electrically conducting semiconductor material.

In the claims and in the following description different embodiments of a method for fabricating an electronic component are described as a particular sequence of processes or measures, in particular in the flow diagram. It is to be noted that the embodiments should not be limited to the particular sequence described. Particular ones or all of different processes or measures can also be conducted simultaneously or in any other useful and appropriate sequence.

FIG. 1 shows a flow diagram for illustrating a method of fabricating a layer stack over a substrate according to a first aspect of the disclosure. The method 100 comprises providing a substrate (block 110), depositing a first Ti based layer on the substrate (block 120), depositing an intermediate Al based layer on the first layer (block 130), depositing a second NiV based layer on the intermediate layer (block 140), depositing a third Ag based layer on the second layer (block 150), and tempering in a way that at least one inter-metallic phase is formed between at least two metals of the group containing Ti, Al, Ni, and V (block 160).

According to an embodiment of the method of the first aspect, the first layer is comprised of nominally pure Ti, the intermediate layer is comprised of nominally pure Al, the second layer is comprised of nominally pure NiV, and the third layer is comprised of nominally pure Ag.

According to an embodiment of the method of the first aspect, tempering is performed in a way that an inter-metallic phase is formed comprising Ni and Al.

According to an embodiment of the method of the first aspect, the substrate may comprise a semiconductor chip, in particular a silicon chip. The semiconductor chip may comprise an electronic device comprising one or more of a transistor, a power transistor, an MOS transistor, an SFET transistor, a vertical transistor, and an insulated gate bipolar transistor (IGBT).

According to an embodiment of the method of the first aspect, the layer stack is deposited on one of the main surfaces of the substrate. According to an embodiment thereof, the layer stack may be deposited on an entire main surface of the substrate. However, it is also possible that the layer stack is deposited only on predetermined portions of a main face of the substrate. The predetermined portions may be comprised of electrical contact terminals of an electrical device disposed in the substrate, in particular contact terminals of a transistor like source, drain, and gate contact terminals.

According to an embodiment of the method of the first aspect, the first Ti based layer is deposited with a thickness in a range from 100 nm-400 nm.

According to an embodiment of the method of the first aspect, the second NiV based layer is deposited with a thickness in a range from 200 nm-400 nm.

According to an embodiment of the method of the first aspect, the intermediate layer is deposited with a thickness in a range from 30 nm-50 nm.

According to an embodiment of the method of the first aspect, the third layer is deposited with a thickness in a range from 200 nm-600 nm.

According to an embodiment of the method of the first aspect, one or more of the first to third layers and the intermediate layer is deposited by sputtering, in particular within one and the same reactor chamber.

According to an embodiment of the method of the first aspect, tempering is performed in a temperature range from 300° C.-400° C. and for a time duration in a range from 20 min-40 min.

According to an embodiment of the method of the first aspect, the layer stack is deposited by using a lift-off method. In particular, a sacrificial layer like, for example, a photoresist layer, can be deposited on the substrate in portions other than the predetermined portions, the layer stack can be deposited on the substrate in the predetermined portions and on the sacrificial layer, and afterwards the sacrificial layer is removed so that the layer stack remains only on the predetermined portions.

According to an embodiment of the method of the first aspect, the layer stack is applying an etching process, in for example a wet etching process. At first the layer stack can be deposited on the entire substrate surface, afterwards a mask layer can be deposited on the predetermined portions wherein the mask layer can in principle be made of any material which comprises good adhering properties to the substrate surface, in particular to a metal surface. The mask layer can, for example, comprise a photosensitive resist. Afterwards an etching process can be employed for removing the unmasked portions of the layer stack. For the etching process a wet etching medium can be used wherein it may be necessary to use different etching mediums for etching the different metals of the layer stack (for example hydrogen fluoride for etching Ti). In principle also dry etching can be employed as, for example, plasma etching or reactive ion etching, for etching the unmasked portions.

Figure 2A:
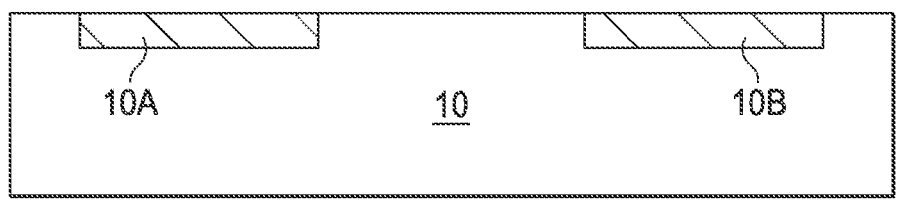
FIGS. 2A-2E show schematic cross-sectional side view representations to illustrate a method of fabricating a layer stack over a substrate according to an embodiment.

FIGS. 2A-2D show schematic cross-sectional side view representations for illustrating a method for fabricating a layer stack over a substrate according to an embodiment. FIG. 2A shows a substrate 10 which may be comprised of a semiconductor chip, in particular a silicon chip. The substrate 10 may comprise an electrical device like one or more of a transistor, a power transistor, an MOS transistor, an SFET transistor, a vertical transistor and an IGB transistor. In any case, the electrical device may comprise electrical contact terminals 10A and 10B at a main face of the substrate 10. The electrical contact terminals 10A and 10B may be comprised of doped areas of the substrate 10. It is intended to deposit electrical contact layers selectively on the electrical contact terminals 10A and 10B.

Figure 2B:
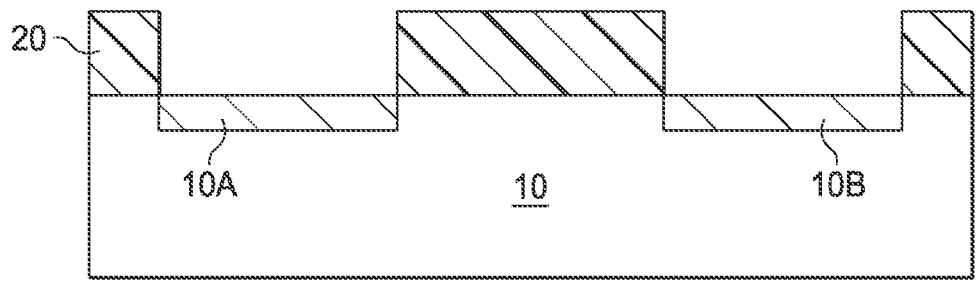

For this purpose, as shown in FIG. 2B, a sacrificial stencil layer 20, in particular a photoresist layer, is deposited on the surface of the substrate 10 and thereafter an inverse pattern is created in the sacrificial layer 20 by etching openings in the sacrificial layer 20 above the electrical contact terminals 10A and 10B.

Figure 2C:
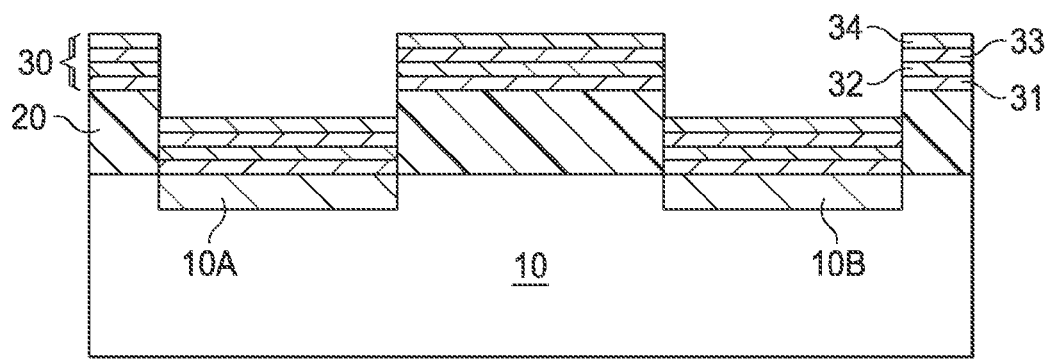

Thereafter, as shown in FIG. 2C, a layer stack 30 is deposited over the whole area, thereby covering the electrical contact terminals 10A and 10B and also staying on the top of the sacrificial layer 20 in those regions, where the sacrificial layer 20 was not previously etched. The layer stack 30 is comprised of a first Ti based layer 31, an intermediate Al based layer 32, a second NiV based layer 33, and a third Ag based layer 34. The thickness of the first layer can be in the range from 200 nm-400 nm, the thickness of the intermediate layer can be in the range from 30 nm-50 nm, the thickness of the second layer can be in the range from 200 nm-400 nm, and the thickness of the third layer can be in the range from 400 nm-600 nm.

Figure 2D:
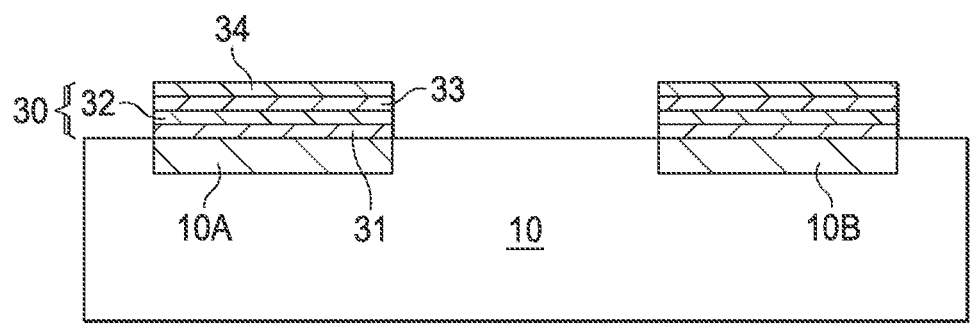

Thereafter, as shown in FIG. 2D, the sacrificial layer 20 is washed away. In particular, in case of a photoresist as the sacrificial layer, an appropriate solvent can be used to remove the photoresist. As a result, the material of the layer stack on top of the sacrificial layer regions is lifted off and washed together with the sacrificial layer below. After the lift-off the layer stack remains only in the regions of the electrical contact terminals 10A and 10B.

Figure 2E:
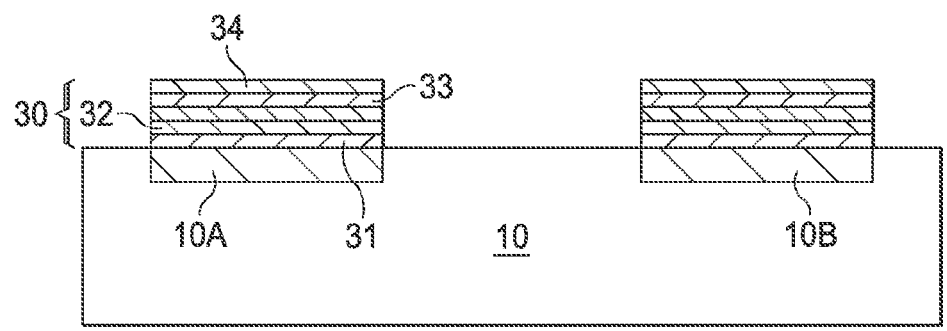

Thereafter a tempering or annealing process can be carried out at 350° C. for 30 min so that the Al of the intermediate layer 32 either in total or at least in part is converted to inter-metallic phases like, for example, an Al—Ni inter-metallic phase. These inter-metallic phases may later serve as a barrier against Sn in a soldering process in which Sn is used one or the main soldering material. In this way corrosion at the interface can be prevented. An embodiment where a portion of the intermediate layer 32 is converted into an intermetallic phase is shown in FIG. 2E.

Figure 3A:
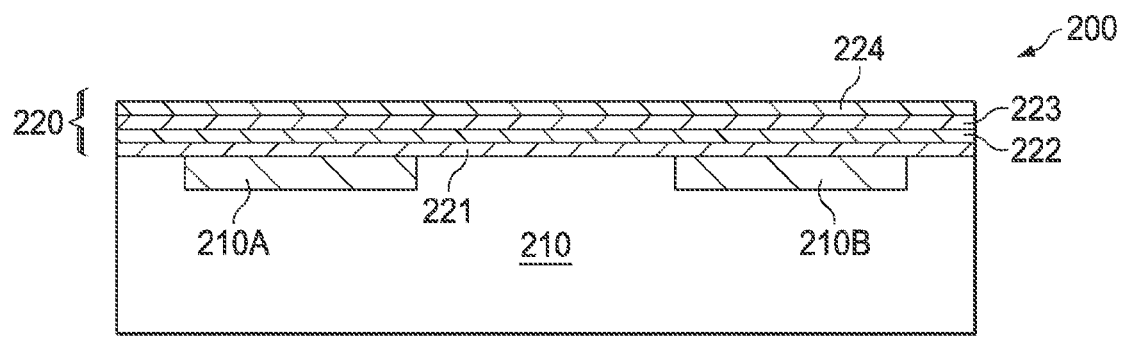
FIG. 3A-3C show a schematic cross-sectional side view representation of an electronic module according to an embodiment.
Figure 3B:
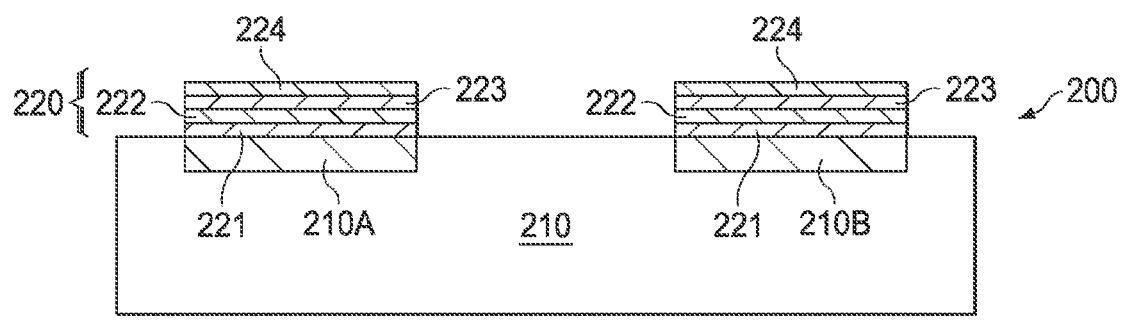

FIGS. 3A and 3B show a schematic cross-sectional side view representation of an electronic module according to a second aspect of the disclosure. The electronic module 200 comprises a substrate 210 and a layer stack 220 arranged over the substrate 210. The layer stack 220 comprises a first Ti based layer 221 disposed over the substrate 210, a second NiV based layer 223 disposed over the layer 222, and a third Ag based layer 124 disposed over the second layer 223.

Figure 3C:
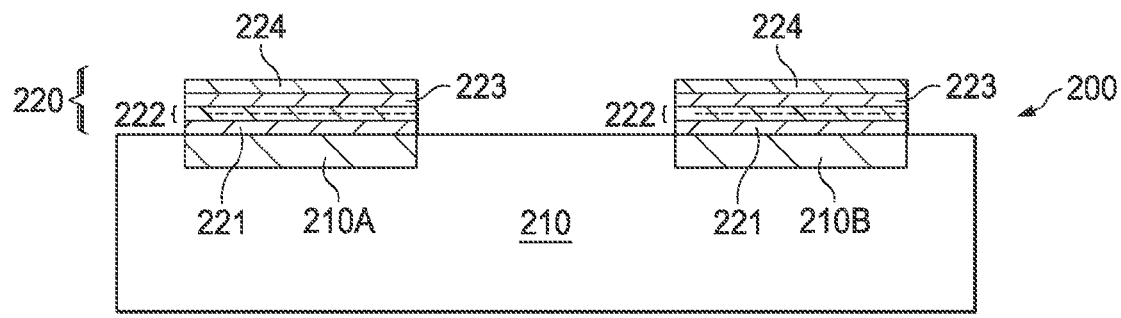

According to an embodiment of the electronic module of the second aspect, the intermediate layer 222 between the first and second layers 221 and 223 contains at least one inter-metallic phase between at least two metals of the group containing Ti, Al, Ni, and V. According to an embodiment thereof, the intermediate layer 222 contains an inter-metallic phase comprising Al and Ni. An embodiment of this is shown in FIG. 3C.

According to an embodiment of the electronic module of the second aspect, the substrate 210 comprises silicon. In particular the substrate 210 comprises a semiconductor chip like a silicon chip. The substrate may comprise an electronic device in or on the substrate 210, wherein the electronic device may be one or more of a transistor, a power transistor, an MOS transistor, an SFET transistor, a vertical transistor and an IGBT transistor. The substrate thickness can be in a range from 50 μm-300 μm.

According to an embodiment of the electronic module of the second aspect, the substrate 210 may comprise electrical contact terminals 210A and 210B, which may be comprised of doped areas of the substrate and which may be comprised of electrical contact terminals of an electrical device disposed in or on the substrate 210. The layer stack 320 may be arranged selectively on the electrical contact areas 210A and 210B.

According to an embodiment of the electronic module of the second aspect, the layer stack 220 may be arranged on or above an entire main surface of the substrate 210, as shown in FIG. 3A. However, the layer stack 220 may also be arranged on or over predetermined portions of a main surface of the substrate 210 like, for example, the electrical contact terminals 210A and 210B, as shown in FIG. 3B.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A layer stack, comprising:
   a first layer, wherein the first layer contains Ti and has a thickness in a range from 100 nm to 400 nm;
   an intermediate layer disposed over the first layer, wherein the intermediate layer contains Al and has a thickness in a range from 30 nm to 50 nm, wherein the Al is partly converted to an intermetallic phase with a metal from the group consisting of Ti, Ni and V;
   a second layer disposed over the intermediate layer, wherein the second layer contains NiV and has a thickness in a range from 200 nm to 400 nm; and
   a third layer disposed over the second layer, wherein the third layer contains Ag and has a thickness in a range from 200 nm to 600 nm.

2. An electronic module according to claim 1, further comprising a substrate, wherein the layer stack is disposed on the substrate.

3. The electronic module according to claim 2, further comprising at least one electronic device in or on the substrate.

4. The electronic module according to claim 3, wherein the electronic device comprises one or more of a power transistor, a MOS transistor, an SFET transistor, a vertical transistor, and an Insulated Gate Bipolar (IGB) transistor.

5. The electronic module according to claim 2, wherein the layer stack is arranged over only predetermined portions of a main surface of the substrate.

6. The electronic module according to claim 5, wherein the predetermined portions comprise electrical contact terminals of an electrical device.

7. The electronic module according to claim 2, wherein the layer stack is arranged over an entire main face of the substrate.

* * * * *